United States Patent
Condemi et al.

(10) Patent No.: US 6,243,310 B1
(45) Date of Patent: Jun. 5, 2001

(54) CIRCUIT AND METHOD FOR AUTOMATICALLY REGULATING THE EQUALIZATION DURATION WHEN READING A NONVOLATILE MEMORY

(75) Inventors: Carmelo Condemi; Michele La Placa, both of Di Catania; Ignazio Martines, Catania, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/546,975

(22) Filed: Apr. 11, 2000

(30) Foreign Application Priority Data

Apr. 13, 1999 (IT) .............................. TO99A0291

(51) Int. Cl.[7] .............................. G11C 7/00; G11C 16/06
(52) U.S. Cl. ........................................ 365/203; 365/185.2
(58) Field of Search ................................ 365/203, 185.2, 365/189.07, 185.21, 185.19, 185.33

(56) References Cited

U.S. PATENT DOCUMENTS

| | | | |
|---|---|---|---|
| 5,805,500 | * 9/1998 | Campardo et al. | 365/185.2 |
| 5,886,925 | * 3/1999 | Campardo et al. | 365/185.21 |
| 5,973,959 | * 10/1999 | Gerna et al. | 365/185.03 |

* cited by examiner

*Primary Examiner*—Amir Zarabian
*Assistant Examiner*—Anh Phung
(74) *Attorney, Agent, or Firm*—Theodore E. Galanthay; E. Russell Tarleton; Seed IP Law Group PLLC

(57) ABSTRACT

An equalization control circuit having an equalization signal generating stage having an enabling input receiving an address transition signal, a disabling input receiving a disabling signal, and an output generating an equalization control signal. An auxiliary line is supplied at one initial terminal (35a) with a biasing voltage correlated to the reading voltage supplied to the addressed array cell. An equalization filter is connected to the end terminal of the auxiliary line and generates the disabling signal when the voltage at the end terminal of the auxiliary line exceeds a preset threshold value.

11 Claims, 4 Drawing Sheets

CIRCUIT AND METHOD FOR AUTOMATICALLY REGULATING THE EQUALIZATION DURATION WHEN READING A NONVOLATILE MEMORY

TECHNICAL FIELD

The present invention pertains to a circuit and a method for automatically regulating the equalization duration when reading a nonvolatile memory.

BACKGROUND OF THE INVENTION

As is known, when reading a nonvolatile memory cell, the logic state (either erased or written) of the memory cell should be discriminated as fast as possible.

For this purpose, the cell to be read is connected to a read circuit, an embodiment whereof is shown in FIG. 1. In detail, a memory cell 1 belonging to a memory array 2 has its drain terminal connected to a bit line 11, connected, via a decoding and biasing circuit 3, to a read circuit 4 comprising a current-to-voltage converter 5, an equalization circuit 6, and a comparator 7. The memory cell 1 to be read moreover has its source terminal connected to ground and its gate terminal connected to a word line 8 biased at a voltage $V_B$.

A reference cell 10 has its source terminal grounded, its gate terminal biased at a voltage $V_G$, and its drain terminal connected to a reference line 12, which is also connected to the current-to-voltage converter 5 through the decoding and biasing circuit 3.

The decoding and biasing circuit 3, of a known type, has the purpose of selecting the bit line 11 connected to the drain terminal of the memory cell 1 to be read. In addition, the decoding and biasing circuit 3 has the purpose of appropriately biasing the bit line 11, as well as the reference line 12.

The read circuit 4 detects the current $I_M$ and $I_R$ flowing, respectively, in the memory cell 1 to be read and in the reference cell 10, and compares them to establish whether the memory cell 1 is written or erased. In particular, comparison between the currents $I_M$ and $I_R$ is made by evaluating the unbalancing of the array node 14 and reference node 15, which form outputs of the current-to-voltage converter 5 and are connected, through the decoding and biasing circuit 3, respectively to the bit line 11 and to the reference line 12.

The equalization circuit 6 comprises pre-charging and equalization circuits that are essential for obtaining reduced times of access to the memory cell 1 to be read. The equalization circuit 6 has the purpose of initially bringing the array node 14 and the reference node 15 (on which voltages $V_M$ and $V_R$ are present) to the same voltage value, so that, when they are released, they may reach the final values quickly and without any indecision. An example of timing of the equalization circuit 6 is shown in FIG. 2, in which ATD is an address transition signal having a pulse at the transition of the addresses; SAEQ is an equalization control signal; $V_M$ and $V_R$ are the voltages at the array node 14 and reference node 15, respectively; and $V_B$ is the row voltage applied to the word line 8 to which the memory cell 1 to be read is connected.

In FIG. 2, following upon transition of an address, the address transition signal ATD presents a pulse, which, in turn, activates the equalization phase, determining the equalization control signal SAEQ to switch from low to high. Switching of the equalization control signal activates the equalization circuit 6, and the voltages $V_M$ and $V_R$ on the array node 14 and the reference node 15, respectively, are equalized (portion EQ), and hence have the same value. In the meantime, the row voltage $V_B$ increases up to the supply voltage $V_{dd}$ and is then boosted via a charge pump circuit (not shown—FIG. 1), as is usual in memories operating at a low supply voltage. As soon as the equalization control signal SAEQ switches back to low again, the array node 14 and the reference node 15 are free to move according to the intensity of the currents in the memory cell 1 and in the reference cell 10. In the example of FIG. 2, the memory cell 1 to be read is erased; consequently, the voltage VM on the array node 14 decreases with respect to the equalization value, while the reference voltage $V_R$ on the reference node 15, after a short transient, increases with respect to the equalization value.

The duration of the pulse of the equalization control signal SAEQ must be selected with great care since it depends upon the evolution of the voltages $V_M$ and $V_R$ on the array node 14 and the reference node 15, and thus the access time to the memory cell 1 to be read. In particular, to have fast reading without uncertainties, the equalization circuit must be deactivated only when the erased array cells 1 absorb a current greater than that of the reference cell 10. In particular, with a longer duration, reading becomes unacceptably slow, and with a shorter duration, it is possible that there will be uncertainty of reading or else it is necessary for the read time to be decidedly lengthened. In fact, if the voltage on the gate terminal of the memory cell 1 to be read has not yet reached the optimal value, the erased cells could be interpreted momentarily as being written and the voltages on the array node 14 and the reference node 15 could move in the direction opposite to the correct one. In this case, only when the current in the addressed bit line 11 exceeds the current of the reference line 12, do the voltages on the array node 14 and the reference node 15 invert their direction; from this moment on, a certain time is in any case necessary for the voltages on the array node 14 and the reference node 15 to cross and move on to the correct values, thus leading all round to a considerable loss of time.

In the known circuits, to determine the duration of the pulse of the equalization control signal SAEQ the voltage supplied to the drivers of the word lines 8 is observed; only when this (boosted) voltage exceeds by a predetermined amount the supply voltage $V_{dd}$ (voltage $V_{EE}$ in FIG. 2), an appropriate sensing circuit blocks equalization, causing the equalization control signal SAEQ to switch. An example of a circuit for generating the equalization control signal SAEQ is shown, for example, in FIG. 3.

In detail, FIG. 3 shows a charge pump stage 18 of the "single-shot" type based, in a per se known manner, upon the alternation between a charging phase and a charge transfer phase, controlled by the switching of an enabling signal AN. In particular, during the charging phase (enabling signal AN high) a capacitor 19 is charged at the supply voltage $V_{dd}$. During the charge transfer phase (enabling signal AN low) the capacitor 19, the bottom terminal of which is raised to the supply voltage $V_{dd}$, transfers its charge to an output capacitor 21.

In this way, the voltage on the output capacitor 21, referred to as monitored voltage $V_1$, and supplied to the driver 22 of the addressed word line 8, is raised to theoretically almost twice the supply voltage $V_{dd}$. The monitored voltage $V_1$ is supplied to a comparator 25 which compares it with a predetermined threshold voltage $V_2$, for example equal to the supply voltage $V_{dd}$ plus a quantity equal to the threshold voltage $V_{th}$ of a P-channel transistor ($V_2 = V_{dd} + V_{th}$); as soon as the comparator 25 switches, an equalization signal generating stage, here represented by a flip-flop 27, is reset, as activated by the address transition signal ATD.

In the latest generations of nonvolatile memories, there has been a reduction of the supply voltage $V_{dd}$ (which has required cell gate voltage boosting), and an increase in the size of the memory array. This latter fact has determined an increase in the time constant associated both to the bit lines and to the word lines.

In particular, the word lines may now have time constants of the order of some ten nanoseconds, which it is to be taken into account when defining the duration of the equalization interval. In fact, the erased cells connected to the end of the word line are delayed in conducting the current necessary for correct reading, as compared to the erased cells connected to the start of the word line.

With the known circuit of FIG. 3, which observes the voltage at the output of the charge pump stage 18 or at the input to the word line 8, it is not possible to foresee in any way the value of the voltage on the gate terminal of the last cell connected to the word line. On the other hand, the progress of the voltage on the last cell may be considerably delayed with respect to the first cell, as shown in the plot of FIG. 4, where the voltage $V_{B1}$ represents the gate voltage of the first cell of the addressed word line, and the voltage $V_{B2}$ represents the gate voltage of the last cell of the addressed word line.

As may be noted, to guarantee reading also of the last cell, preventing dangerous oscillations of the reference node 15, it is necessary to delay the end of equalization by a time interval equal to $\Delta$. However, given that the resistance of the word lines may have a dispersion of between 50% and 100%, and hence the time interval $\Delta$ may vary from memory to memory, a fixed delay does not eliminate the problem discussed above.

SUMMARY OF THE INVENTION

The disclosed embodiments of the present invention overcome the disadvantages of the known solutions.

According to the embodiments of the present invention, a circuit and a method for automatically regulating the equalization duration when reading a nonvolatile memory are provided. More particularly, an equalization control circuit for a memory cell having a gate terminal by a steady read voltage includes an equalization signal generating stage having an enabling input receiving an enabling signal, a disabling input receiving a disabling signal, and an output generating an equalization control signal; an auxiliary line having a first end portion and a second end portion, the first end portion supplied with a biasing voltage correlated to the read voltage; and a detecting means connected to the second end portion of the auxiliary line and generating the disabling signal when the voltage at the second end portion exceeds a preset threshold value.

BRIEF DESCRIPTION OF THE DRAWINGS

For a better understanding of the invention, an embodiment thereof is now described, purely as a non-limiting example, with reference to the attached drawings, wherein.

DETAILED DESCRIPTION

Figure 5:
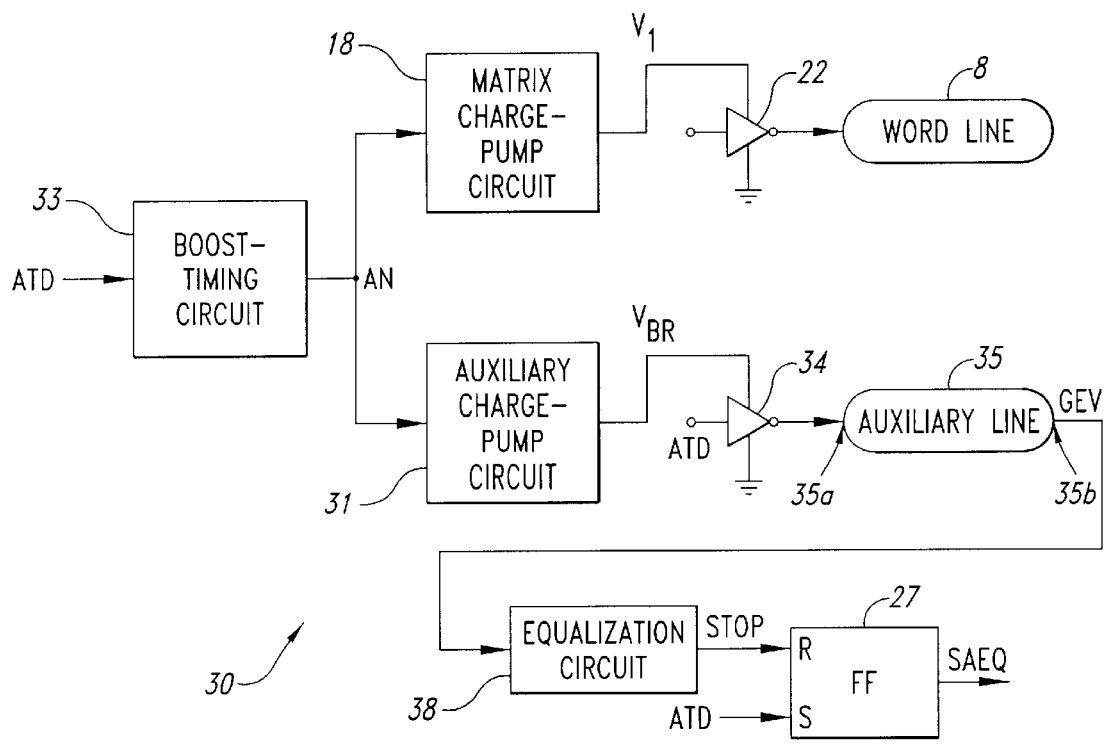
FIG. 5 shows a block diagram of the equalization regulating circuit according to the present invention.

FIG. 5 shows an equalization control circuit 30 capable of delaying the end of the equalization by an interval of time just sufficient for the value of the voltage supplied to the addressed word line 8 to ensure a correct reading also of the last cell of the addressed word line 8. In particular, the equalization control circuit 30 is based on checking the voltage at the end of a special auxiliary word line.

Figure 1:
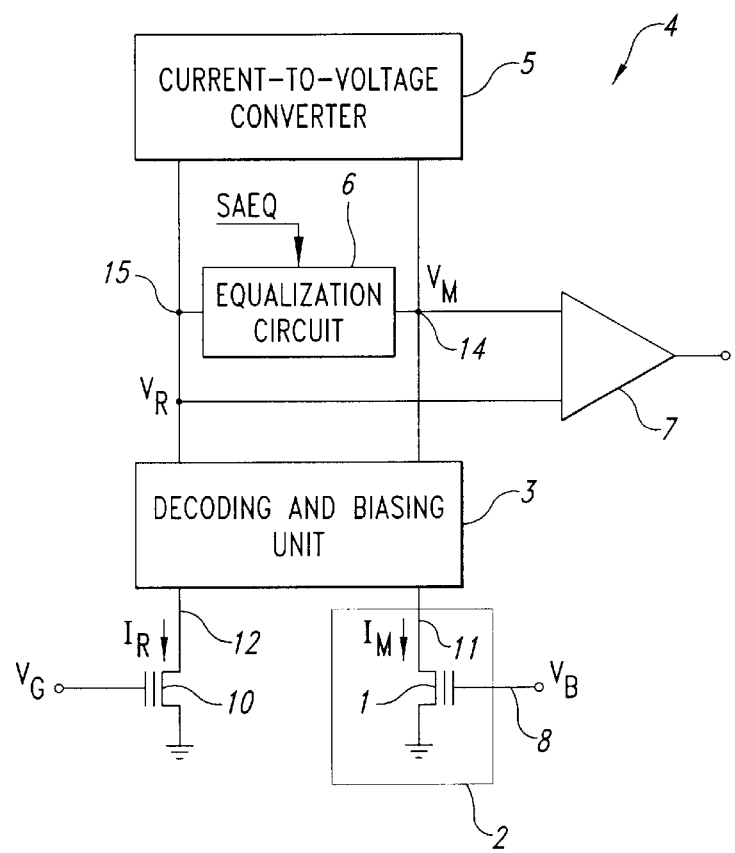
FIG. 1 illustrates a simplified electrical diagram of a read circuit of a nonvolatile memory.
Figure 2:
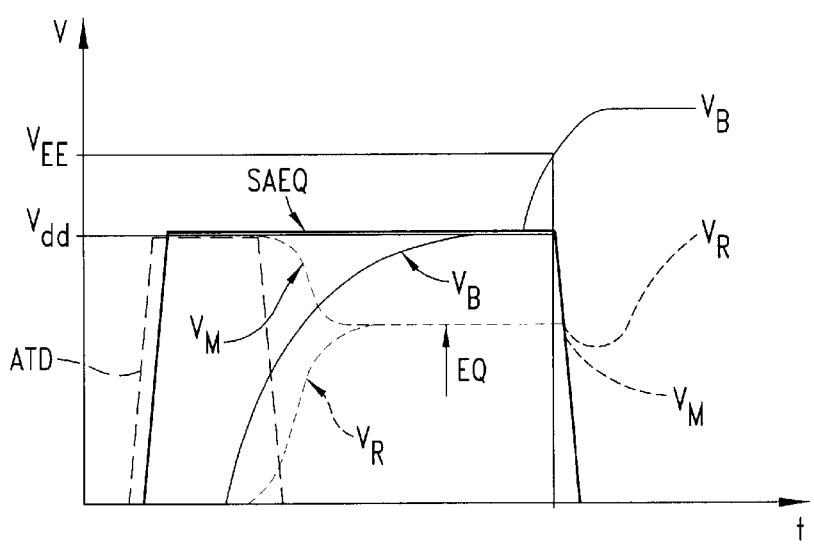
FIG. 2 illustrates the plot of the voltages taken in the read circuit of FIG. 1.
Figure 3:
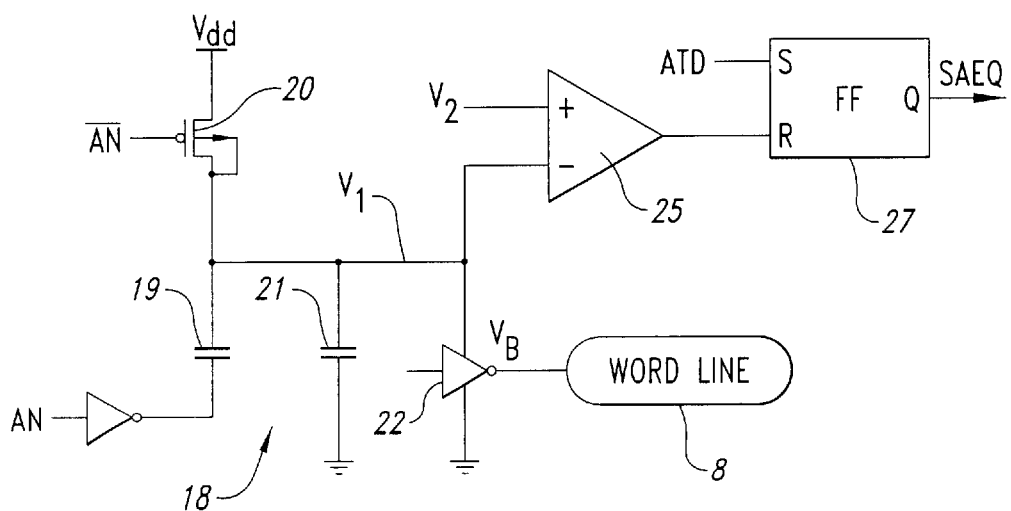
FIG. 3 shows a simplified electrical diagram of a known charge pump circuit and a known equalization control circuit.
Figure 4:
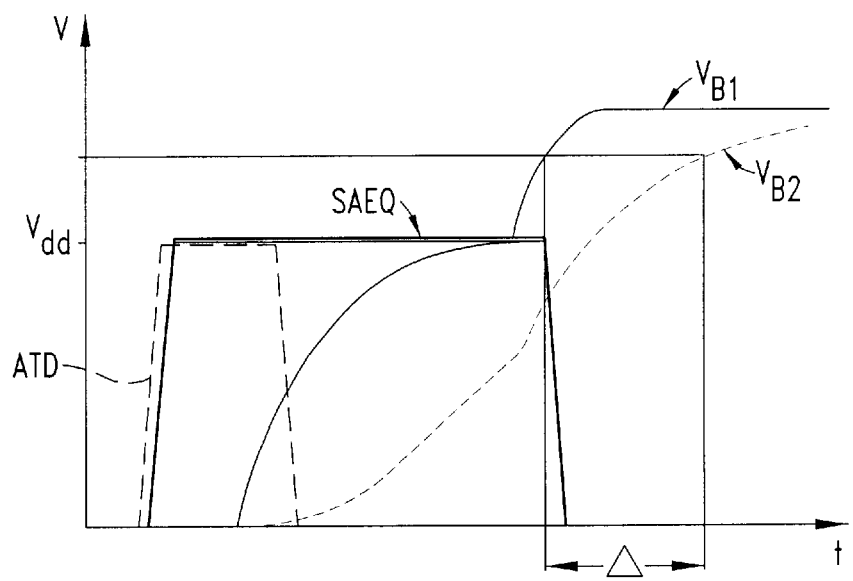
FIG. 4 illustrates the plot of the voltages taken in the read circuit of FIG. 1, for two different cells.

According to the embodiment illustrated in FIG. 5, where the parts in common with FIG. 3 are indicated with the same reference numbers and are not further described, the equalization control circuit 30 comprises an auxiliary charge pump circuit 31 generally similar to the array charge pump circuit 18 shown in detail in FIG. 3 and indicated only schematically in FIG. 5. In particular, the auxiliary charge pump circuit 31 generates at the output an auxiliary boosted voltage $V_{BR}$ and has the same efficiency EFF=$V_{BR}/V_{dd}$=$V_1/V_{dd}$=K as the array charge pump circuit 18, but is much smaller in that it must supply only a single row driver.

Both the array charge pump circuit 18 and the auxiliary charge pump circuit 31 are controlled by the enabling signal AN generated by a boost timing circuit 33 receiving at the input the address transition signal ATD.

The auxiliary boosted voltage $V_{BR}$ is supplied to an auxiliary driver 34 having an input receiving the address transition signal ATD and an output connected to an initial terminal 35a of an auxiliary line 35 having the same nominal characteristics (length, width, resistivity) as the array word lines 8. The auxiliary line 35 has an end terminal 35b on which a monitored voltage GEV is present, and is connected to an input of an equalization filter 38 generating an end-of-equalization signal STOP supplied on the reset input of the flip-flop 27.

In the circuit of FIG. 5, the address transition signal ATD (which signals that there has been a variation in the input signals and has a duration regulated so as to cover addressing of the rows) is used also for timely sending the boosted voltage $V_{BR}$ to the auxiliary line 35; in particular, during the pulse of the address transition signal ATD, the output of the auxiliary driver 34 remains low; as soon as the address transition signal ATD switches to the low state, the boosted voltage $V_{BR}$ is supplied to the auxiliary line 35, which consequently starts to charge.

The equalization filter 38 detects the monitored voltage GEV present at the end terminal 35a of the auxiliary line 35 and, when this reaches a preset value, it generates the end-of-equalization signal STOP.

In this way, the auxiliary word line 35 is always the row with the slowest addressing and it is certain that the voltage at the output of the addressed word line 8 will be greater than or at least equal to the voltage of the output of the auxiliary line 35.

Figure 6:
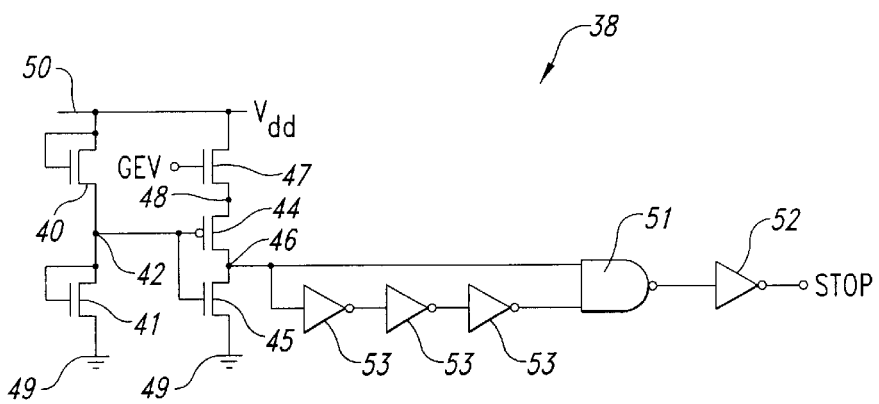
FIG. 6 shows a simplified electrical diagram of a block of FIG. 5.

An example of embodiment of the equalization filter 38 is illustrated in FIG. 6. In detail, a first NMOS transistor 40 and a second NMOS transistor 41 are connected together in series between the supply line 50 set at $V_{dd}$ and the ground line 49 and are diode-connected. The NMOS transistors 40, 41 define a first intermediate node 42 connected to the gate terminal of a PMOS transistor 44 and of a third NMOS transistor 45 connected together in series. Specifically, the third NMOS transistor 45 has its source terminal connected to ground 49 and its drain terminal connected to the drain terminal of the PMOS transistor 44 and defining a second node 46. The PMOS transistor 44 has its source terminal connected to the third node 48; the third node 48 is connected to the source terminal of a fourth NMOS transistor 47 having its drain terminal connected to the supply line 50 and its gate terminal receiving the monitored voltage GEV, which is present on the end terminal 35b of the auxiliary line 35.

The second node 46 is connected to a first input of a NAND gate 51, having a second input connected to the second node 46 through three cascaded inverters 53; the output of the NAND gate 51 is connected to an inverter 52 having an output generating the end-of-equalization signal STOP. In practice, the gates 51–53 form a monostabile circuit or derivative network.

Figure 7:
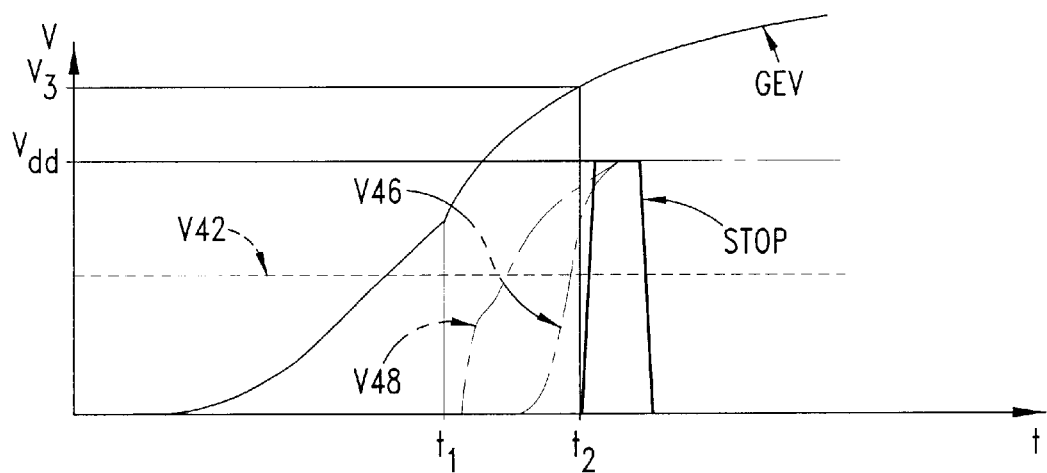
FIG. 7 shows the plot of the voltages taken in the circuit of FIG. 6.

The equalization filter 38 of FIG. 6 operates as follows (referring also to FIG. 7). The NMOS transistors 40, 41 define a voltage divider; in particular, the second NMOS transistor 41 is much more resistive than the first NMOS transistor 40, thus the voltage V42 present on the first node 42 is constant and equal to $V_{dd}-V_{th}$, where $V_{th}$ is the threshold voltage of the first NMOS transistor 40. The transistors 44, 45 and 47 define, in practice, a comparator the inputs of which are formed by the gate terminal of the fourth NMOS transistor 47 and the first node 42. As a result, the third NMOS transistor 45 is on and keeps the voltage V46 present on the second node 46 at a potential next to that of the ground line. The end-of-equalization signal STOP is therefore low. In this phase, the monitored voltage GEV present on the end terminal of the auxiliary line 35 begins to increase starting from zero; at the instant $t_1$ the effect of the array charge pump circuit 18 and the auxiliary circuit 31 begins. In addition, the voltage V48 on the third node 48 is zero.

As the monitored voltage GEV increases, the voltages V46 and V48, on the nodes 46 and 48, start to increase; in the end, when the monitored voltage GEV reaches the value $V_3$ such as to ensure turning on of the transistors 47 and 44 (GEV=$V_{dd}+V_{th}$, where $V_{th}$ is the threshold voltage of the transistors 44 and 47, considered equal, instant $t_2$) the end-of-equalization signal STOP presents a short pulse, the duration whereof is linked to the delay time of the inverter chain 53.

The equalization duration control circuit 30 has the following advantages. First, the equalization control signal SAEQ has a minimal duration, although such as to ensure correct reading of all the memory cells, since biasing of the auxiliary line 35 starts only at the end of the pulse of the address transition signal ATD. In addition, the equalization control signal SAEQ automatically follows any variation of the supply voltage due to temperature and also to any value spread caused by the fabrication process (in particular as regards any resistance variation of the word lines 8) so that the auxiliary line 35 will always be the slowest, and the equalization phase in any case will end as soon as possible, ensuring at the same time correct biasing of the addressed lines.

The circuit 30 thus provides an adaptive equalization which enables the problem affecting the known circuits to be solved in a simple and reliable way. Finally, the equalization filter 38 can monitor correctly the evolution, which is rather slow, of the monitored voltage GEV.

Finally it is evident that modifications and variations may be made to the circuit and method of equalization control described herein, without departing from the scope of the present invention as defined by the claims that follow and the equivalents thereof.

What is claimed is:

1. An equalization control circuit for a memory cell having a gate terminal biased at a read voltage, said equalization control circuit comprising: an equalization signal generating stage having an enabling input receiving an enabling signal, a disabling input receiving a disabling signal (STOP), and an output generating an equalization control signal;

an auxiliary line having a first end portion and a second end portion, said first end portion supplied with a biasing voltage correlated to said read voltage; and detecting means connected to said second end portion of said auxiliary line and generating said disabling signal when the voltage at said second end portion exceeds a preset threshold value.

2. The equalization control circuit of claim 1, further comprising an auxiliary driving circuit having a signal input, a biasing input and an output, said signal input receiving an address transition signal (ATD), said biasing input receiving said biasing voltage ($V_{BR}$) and said output of said auxiliary driving circuit being connected to said first end portion of said auxiliary line.

3. The equalization control circuit of claim 2, further comprising an auxiliary charge pump circuit having an activation input and an output, said activation input connected to an output of a booster voltage timing circuit also connected to an array charge pump circuit, said output of said auxiliary charge pump circuit connected to said biasing input of said auxiliary driving circuit.

4. The equalization control circuit of claim 3, wherein said array charge pump circuit and said auxiliary charge pump circuit have equal efficiency.

5. The equalization control circuit of claim 1 wherein said detecting means comprise comparator means receiving a voltage present on said second end portion of said auxiliary line and a reference voltage.

6. The equalization control circuit of claim 5, wherein said comparator means comprise first, second and third transistor means connected in series between a first reference potential line and a second reference potential line, said first transistor means having a control terminal connected to said second end portion of said auxiliary line and said second and third transistor means having respective control terminals connected together and receiving said reference voltage.

7. The equalization control circuit of claim 6, further comprising constant voltage generating means having an output connected to said respective control terminals of said second and third transistor means.

8. The equalization control circuit of claim 7, wherein said constant voltage generating means comprise a diode element and a resistive element connected reciprocally in series between said first reference potential line and said second reference potential line.

9. The equalization control circuit of claim 6, comprising an intermediate connection node between said second and third transistor means and a monostabile circuit connected to said intermediate connection node and generating said disabling signal.

10. An equalization control method during a reading step, wherein a gate terminal of a memory cell is biased at a read voltage, the method comprising: activating an equalization control signal and disabling the equalization control signal at the end of the equalization step, which comprises supplying a biasing voltage correlated to said read voltage at a first end portion of an auxiliary line, detecting the voltage present on a second end portion of said auxiliary line, and generating a disabling signal of said equalization control signal when the voltage on said second end portion exceeds a preset threshold value.

11. The method of claim 10, wherein said biasing voltage is supplied only at the end of a transition address signaling pulse.

* * * * *